United States Patent
Ham et al.

(10) Patent No.: US 6,731,113 B2
(45) Date of Patent: *May 4, 2004

(54) METHOD OF AND DEVICE FOR THE COMPENSATION OF VARIATIONS OF THE MAIN MAGNETIC FIELD DURING MAGNETIC RESONANCE IMAGING

(75) Inventors: Cornelis L.G. Ham, Eindhoven (NL); Gerardus B.J. Mulder, Eindhoven (NL)

(73) Assignee: Koninklijke Philips Electronics N.V., Eindhoven (NL)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/517,716

(22) Filed: Mar. 2, 2000

(65) Prior Publication Data

US 2003/0137299 A1 Jul. 24, 2003

(30) Foreign Application Priority Data

Mar. 10, 1999 (EP) .............................. 99200721

(51) Int. Cl.$^7$ ................................. G01V 3/00
(52) U.S. Cl. ................... 324/313; 324/315; 324/309
(58) Field of Search ................ 324/300, 307, 324/309, 318, 322, 313, 315, 320

(56) References Cited

U.S. PATENT DOCUMENTS

| | | | | |
|---|---|---|---|---|
| 4,663,592 A | | 5/1987 | Yamaguchi et al. | 324/315 |
| 5,214,383 A | | 5/1993 | Perlmutter et al. | 324/313 |
| 5,278,503 A | * | 1/1994 | Keller et al. | 324/318 |
| 5,304,934 A | * | 4/1994 | Laskaris et al. | 324/318 |
| 5,551,243 A | * | 9/1996 | Palkovich et al. | 62/51.1 |
| 6,064,206 A | * | 5/2000 | Van Vaals et al. | 324/312 |
| 6,114,851 A | * | 9/2000 | Kruspe et al. | 324/303 |
| 6,252,405 B1 | * | 6/2001 | Watkins et al. | 324/319 |
| 6,566,873 B1 | * | 5/2003 | Smith et al. | 324/300 |

FOREIGN PATENT DOCUMENTS

| | | | |
|---|---|---|---|
| EP | 63244602 | 10/1988 | H01F/7/22 |
| EP | 05285118 | 11/1993 | A61B/5/055 |
| EP | 08266511 | 10/1996 | A61B/5/055 |

* cited by examiner

*Primary Examiner*—Diego Gutierrez
*Assistant Examiner*—Tiffany A. Fetzner
(74) *Attorney, Agent, or Firm*—John Vodopia

(57) ABSTRACT

At least one quantity which is characteristic of the temperature-dependent magnetic properties of magnetizable material which interacts with the magnetic fields of a magnetic resonance imaging device is determined in order to compensate the temporally varying strength of the main magnetic field of a main magnet of such a device. On the basis of this quantity a compensation signal is formed for the correction of the influence of the varying field strength on the imaging result.

1 Claim, 3 Drawing Sheets

$$\alpha \to \delta_\alpha(X) \to \delta_{\delta_\alpha(X)}(B_{main})$$

$$B(\alpha) = \delta_{\delta_\alpha(X)}(B_{main})$$

$\alpha$ = A PARAMETER CAPABLE OF EFFECTING A CHANGE IN MAGNETIZEABLE MATERIAL
X = MAGNETIZEABLE MATERIAL IN THE MRI DEVICE
a $\to$ b = a CAUSES b
$\delta_a(b)$ = A CHANGE (OR 'VARIATION') IN b CAUSED BY a
$B_{main}$ = MAIN MAGNETIC FIELD
$B(\alpha)$ = THE VARIATION IN THE MAIN MAGNETIC FIELD CAUSED BY A CHANGE IN THE MAGNETIZEABLE MATERIAL OF THE MRI, WHERE SAID CHANGE WAS CAUSED BY PARAMETER $\alpha$ $$\alpha \rightarrow \delta_\alpha(X) \rightarrow \delta_{\delta_\alpha(X)}(B_{main})$$

$$B(\alpha) = \delta_{\delta_\alpha(X)}(B_{main})$$

$\alpha$ = A PARAMETER CAPABLE OF EFFECTING A CHANGE IN MAGNETIZEABLE MATERIAL $X$ = MAGNETIZEABLE MATERIAL IN THE MRI DEVICE a $\longrightarrow$ b = a CAUSES b $\delta_a(b)$ = A CHANGE (OR 'VARIATION') IN b CAUSED BY a $B_{main}$ = MAIN MAGNETIC FIELD $B(\alpha)$ = THE VARIATION IN THE MAIN MAGNETIC FIELD CAUSED BY A CHANGE IN THE MAGNETIZEABLE MATERIAL OF THE MRI, WHERE SAID CHANGE WAS CAUSED BY PARAMETER $\alpha$

FIG. 2B

METHOD OF AND DEVICE FOR THE COMPENSATION OF VARIATIONS OF THE MAIN MAGNETIC FIELD DURING MAGNETIC RESONANCE IMAGING

BACKGROUND OF THE INVENTION

1. Field of the Invention

The invention relates to a method of determining a compensation signal for the compensation of a temporally varying field strength of the main magnetic field of a main magnet of a magnetic resonance imaging device which also includes at least one gradient field coil for generating a gradient magnetic field and a magnetizable material which interacts with the magnetic fields of the device.

2. Description of Related Art

Magnetic resonance imaging devices are known per se, for example for the imaging, by way of magnetism, of a body, such as the human body, or parts of a body. In literature such imaging is also referred to as "Magnetic Resonance Imaging (MRI)" or "Nuclear Magnetic Resonance (NMR)".

A typical magnetic resonance imaging device, for example as known from U.S. Pat. No. 5,214,383, includes a receiving space for accommodating an object to be imaged. A steady or main magnetic field is generated in said receiving space by means of a magnet. In order to select a region to be imaged in the relevant object, one or more so-called gradient coils are provided so as to superpose magnetic field gradients on the main magnetic field. Generally speaking, the gradient field coils produce linear variations of the main magnetic field along the x, the y and the z axis of a cartesian co-ordinate system. In order to achieve resonance for nuclei in a selected body region to be imaged, there are provided one or more RF coils which are also capable of acting as a receiver for signals emitted by resonating nuclei.

An important condition imposed on this type of imaging apparatus is that in operation the main magnetic field should be as uniform and constant as possible during the acquisition of imaging data. Fluctuations in the main magnetic field have a direct negative effect on the imaging accuracy of the device.

For the detection of the generally comparatively slow variations of the field strength of the main magnetic field, taking place with a frequency of the order of magnitude of 10 Hz or less, the cited U.S. Pat. No. 5,214,383 describes the use of a plurality of sensors for measuring the field strength variations. The gradient magnetic field superposed on the main magnetic field by the gradient field coils is zero only at the center of the magnet, so that this location represents the ideal position for the installation of sensors for measuring the comparatively slow main magnetic field variations. In a device for magnetic resonance imaging, however, the center of the magnet is not available, because the center is situated in the receiving space for the object, for example the body of a patient to be examined.

Citation of a reference herein, or throughout this specification, is not to construed as an admission that such reference is prior art to the Applicant's invention of the invention subsequently claimed.

SUMMARY OF THE INVENTION

Therefore, it is a first object of the invention to provide a novel and improved method for determining a compensation signal for the compensation of variations of the field strength of the main magnetic field.

In a device for magnetic resonance imaging of the kind set forth this object is achieved according to the invention in that at least one quantity which is characteristic of the temperature-dependent magnetic properties of the magnetizable material is determined, the compensation signal being provided on the basis of said quantity.

The invention is based on the recognition of the fact that the magnetic properties of the magnetizable material of the device, such as the shim iron which is used for shimming the main magnet and/or magnetizable material which is used for magnetic shielding and with which the magnetic fields of the device interact, will change under the influence of heating during use. Such changing has several adverse effects, such as drift in the main magnetic field. A compensation signal which represents the variations in time of the field strength of the main magnetic field can be obtained by determining a quantity or quantities characteristic of such temperature-dependent variations.

According to a preferred version of the method in accordance with the invention, the electric signal applied to the gradient magnetic field coil, or to each gradient magnetic field coil, is determined as the characteristic quantity. This version is based on the recognition of the fact that in practice the waveforms of the signals in the gradient field coil, or each gradient field coil, are accurately known, so that the thermal behavior of a gradient field coil is also known. This means that for a given gradient waveform, at which electric power is dissipated in the coil, the magnetic properties of the magnetizable material used therein or interacting therewith will vary in conformity with a given mathematical model because of induction effects such as eddy currents. The exact effect on the field strength of the main magnetic field can be calculated for a given quantity and configuration of the magnetizable material. This is possible notably when the main magnet is composed of superconducting or practically superconducting coils with a negligibly low power dissipation. When the main magnet itself includes a field coil which has a resistance which is not negligibly small with a view to power dissipation, the effect of the thermal behavior of the magnetizable material on the variation and the strength of the main magnetic field can be further determined by measuring a relevant further quantity which is characteristic of the variations of the magnetic properties of the magnetizable material, for example, the electric power dissipated in the main magnetic field coil.

As opposed to prior art, the determination of the compensation signal according to the invention in principle does not require a separate sensor or sensors. However, in the context of the invention the use of sensors is by no means excluded.

In another version of the invention, therefore, the temperature of the magnetizable material is measured directly as the characteristic quantity. Such a measurement is performed, for example by means of one or more appropriate sensors which need not be arranged in or at the center of the receiving space of the device. Such a temperature measurement offers the advantage that all effects contributing to the heating of the magnetizable material are cumulatively included.

The method according to the invention also has a version in which the compensation signal is determined on the basis of a predetermined functional relationship between the temperature-dependent magnetic properties of the magnetizable material and the relevant characteristic quantity or each relevant characteristic quantity.

It is notably when no direct mathematical relationship exists between variations in the main magnetic field which are due to variations of the magnetic properties of one or more of the gradient field coils, that according to another version yet of the method in accordance with the invention use can be made of a look-up table in which the relevant functional relationship is recorded. The input parameter is the measured characteristic quantity and whereas the output parameter is formed by the compensation signal or representations thereof. In the case of main magnetic field coils which are not composed of superconductors, the main magnetic field can be compensated by controlling the electrical energizing of the main magnetic field coil by means of the compensation signal determined in accordance with the invention. The main magnetic field can thus be kept constant without requiring the use of further compensation coils and the like. However, the invention can also be used for devices which are provided with supplementary coils, so-called $B_o$ coils, for the compensation of variations of the main magnetic field.

It can be demonstrated that in a device for magnetic resonance imaging there is no difference between the optimum result of an image when the main magnetic field and a main oscillator (synthesizer) are both extremely stable or when both vary in time in the same way. Most contemporary magnetic resonance imaging devices include a synthesizer whose frequency and phase can be adjusted.

According to a preferred version of the method in accordance with the invention, variations of the field strength of the main magnetic field are compensated for the imaging result in that during use the frequency of the RF oscillator means is adapted in conformity with the compensation signal determined.

Instead of or in addition to the compensation of the frequency of the RF oscillator means and/or the main magnetic field, according to the invention it is also possible to provide a compensation signal whereby the final result, i.e. the information signal, can be compensated in respect of faults due to field strength variations. To this end, the compensation signal can suitably co-operate with processing means which deliver the ultimate information signal, so that compensation can be realized entirely on the basis of software.

In accordance with the method of the invention, the variation of the field strength of the main magnetic field can be determined and compensated, if necessary, prior to a data acquisition period. Such compensation is generally considered to be adequate for slow variations of the main magnetic field, for example as caused by the slow rise or drop in temperature of the magnetizable material of one or more of the field gradient coils or the main magnetic field coil itself. In the case of faster variations of the field strength of the main magnetic field, however, in conformity with the method of the invention the variation of the field strength of the main magnetic field can be determined and compensated, if necessary, one or more times during a data acquisition period.

In addition to variations of the main magnetic field which are due to changing magnetic properties of the field gradient coils, other sources of disturbances having an effect on the field strength of the main magnetic field are also known in practice.

Therefore, according to a further version yet of the method of the invention the compensation signal is co-determined by determination of variations of the field strength of the main magnetic field which are caused by one or more further quantities, including external magnetic fields, atmospheric pressure and vibrations exerted on the main magnet, the degree of compensation being determined on the basis of a relevant function which indicates the effect of a measured quantity on the main magnetic field.

A compensation signal thus generated is capable of eliminating undesirable variations of the field strength, affecting the quality of the image, to a high degree.

The invention also provides a device for magnetic resonance imaging, including a receiving space for accommodating an object to be imaged, a main magnet for generating a main magnetic field in the receiving space, at least one gradient field coil and at least one high-frequency (RF) coil, energizing means and control means for energizing and controlling the main magnet, the gradient field coil and the RF coil, and processing means which are actively coupled to the energizing and control means in order to determine a compensation signal for the compensation of a temporally varying field strength of the main magnetic field, which device is characterized in that the processing means are arranged to carry out the method according to the invention as described above.

The method according to the invention is suitable not only for use in conjunction with magnetic resonance imaging devices for, for example, medical applications, but essentially with any device which involves a main magnetic field and auxiliary magnetic fields which have magnetic properties which vary during operation, for example devices for spectroscopy.

BRIEF DESCRIPTION OF THE DRAWING

The invention will be described in detail hereinafter on the basis of a magnetic resonance imaging device and with reference to the accompanying Figures.

FIG. 2B shows a symbolic representation of the functional relationship between each quantity in FIG. 2A and the variation in the main magnetic field.

DETAILED DESCRIPTION OF THE PREFERRED EMBODIMENT

Figure 1:
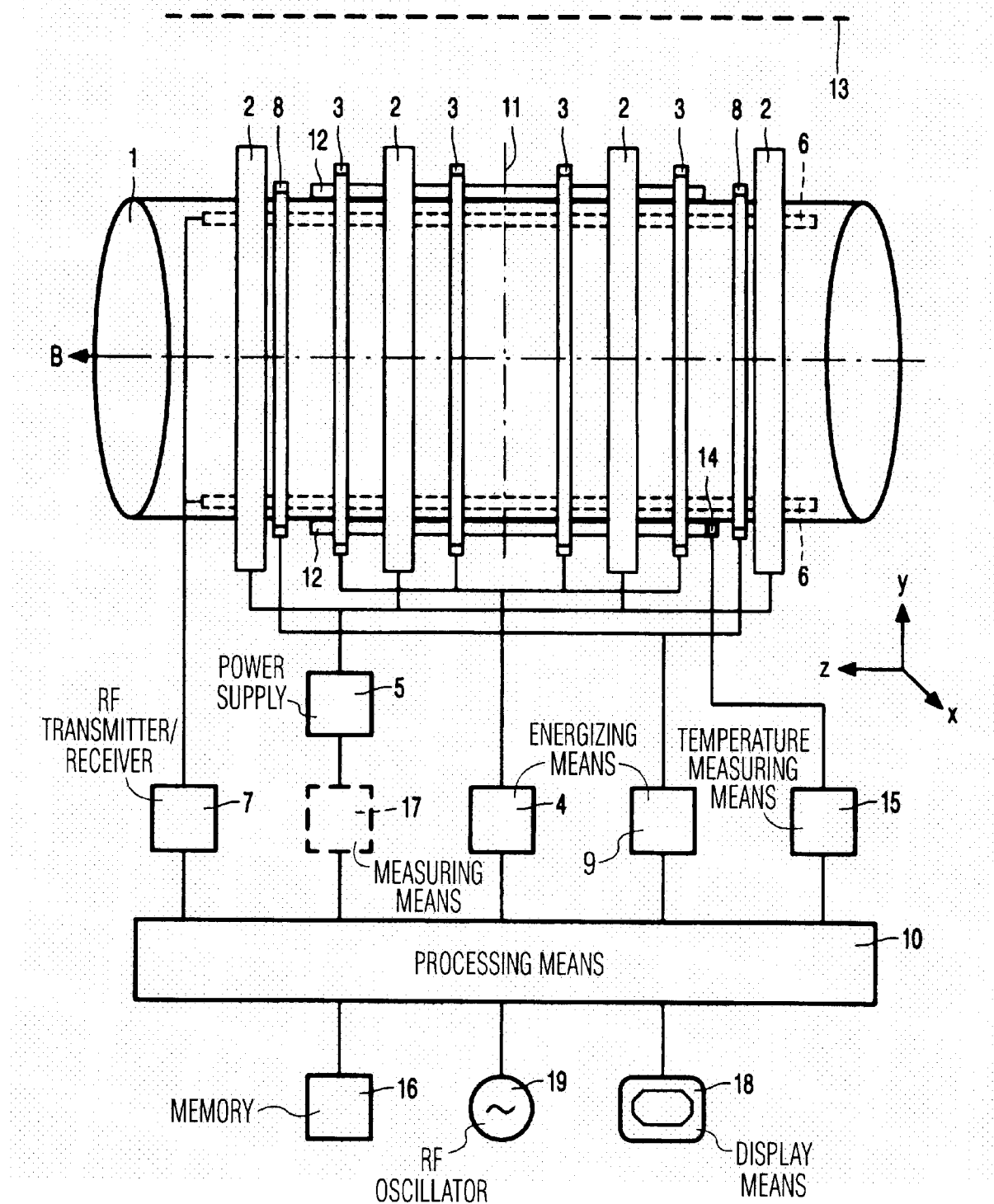
FIG. 1 shows diagrammatically a device for magnetic resonance imaging according to the invention.

A device for magnetic resonance imaging as shown in FIG. 1 includes a receiving space 1 for accommodating an object, for example a human body, of which an image or a partial image is to be made (not shown).

A magnet system 2 is provided so as to generate a steady magnetic field or main magnetic field B in the receiving space 1; it includes one or more steady field coils or main magnetic field coils which are composed of superconductors or conductors having a resistance which is not negligibly small in respect of power dissipation. A gradient magnetic field G can be superposed on the main magnetic field B in the receiving space 1 by means of gradient field coils 3 which may be arranged between the main magnetic field coils. Generally speaking, the gradient field coils 3 are arranged to produce a gradient magnetic field in the x, the y and the z direction of a cartesian system of co-ordinates. The z axis is then chosen to be coincident with the direction of the main magnetic field B. A given cross-section or slice 11 of the body in the receiving space 1 can be selected by appropriate control of the gradient field coils 3 by means of energizing means 4 which are capable of producing predetermined energizing signals such as current waveforms $I_{x,y,z}$. The magnet system 2 is energized by a power supply or energy source 5.

High-frequency (RF) coils 6 are provided so as to produce resonance of nuclei in the object in the receiving space 1. The RF coils 6 in the present embodiment also serve as a receiver for the detection of resonance signals originating from the object to be examined in the receiving space 1. To this end, the RF coils 6 are coupled to an RF transmitter/receiver 7. Also known in practice are devices which utilize separate RF coils for the excitation of nuclei in an object and for the reception of resonance signals.

The energizing means 4, 5 and the RF transmitter/receiver 7 are actively coupled to processing means 10 for the selection of a desired cross-section or slice 11 and for appropriate excitation thereof by means of an RF oscillator or synthesizer 19. The processing means 10 control display means 18 for the display of an acquired image.

The gradient field coils 3 in the present embodiment are integrated with the shim iron 12 in order to keep the receiving space 1, being the inner bore of the magnet system, as small as possible so that the cost of the device remains as low as possible. The shim iron is used so as to "shim" the magnet system 2.

Because of the integration of the gradient field coils 3 and the shim iron 12, but generally also because of the presence of any magnetizable material which is subject to the magnetic fields of the device and interacts therewith, for example an external magnetic shield 13, there is the drawback that variations of the magnetic properties of the magnetizable material which are caused by temperature fluctuations cause variations of the field strength of the main magnetic field B.

A field strength of the main magnetic field B which varies in time has an adverse effect on the quality of the image.

In order to compensate field strength variations of the main magnetic field B, auxiliary magnetic field coils or $B_o$ coils 8 are used in practice. Such $B_o$ coils 8 are driven, via the processing means 10 and the energizing means 9, in such a manner that the $B_o$ field compensates variations of the main magnetic field B as well as possible.

The energizing signals $I_{x,y,z}$ of the gradient field coils 3 are accurately known in the practice of forming an image of an object. Because the device itself and its immediate vicinity, i.e. the shield 13, are steady, the interaction between the gradient magnetic fields and the magnetizable material 12, 13, and hence the temperature variations therein which are due to induction, eddy currents etc., can be derived directly from the energizing signals $I_{x,y,z}$ of the gradient field coils 3 in conformity with the idea of the invention.

It is notably when the main magnetic field B is generated by a magnet system 2 with magnetic field coils which have a resistance which is not negligibly low in respect of power dissipation (development of heat), as opposed to superconducting coils, that the invention also proposes determination of the effect of such magnetic field coils on the variations in the magnetizable material 12, 13. To this end, the energizing signals of the energizing means 5 can be analyzed by means of the processing means 10 or, if desired, separate measuring means 17 may be used as indicated by means of dashed lines in FIG. 1. Instead of or as a supplement to the electrical determination of the temperature variation of the magnetizable material 12, 13, of course, the temperature of the shim iron 12 and possibly the shield 13 can also be measured directly by means of appropriate measuring means 14, for example a known temperature sensor. The foregoing is illustrated by the measuring means 15.

The signal supplied by the measuring means 15 is applied to the processing means 10 in order to determine therefrom a compensation signal which is a measure of the variations in time of the main magnetic field B.

When the effect of the varying magnetic properties of the magnetizable material 12, 13 on the main magnetic field B is known, and also the iron content, the degree of compensation can be determined therefrom in order to keep the steady magnetic field B constant. In order to keep the main magnetic field B constant, the processing means 10 can suitably control the energizing means 9 for the $B_o$ coils 8 on the basis of the compensation signal.

However, it is alternatively possible to control the RF oscillator or synthesizer 19 of the device by means of the compensation signal determined in accordance with the invention, i.e. to vary the frequency thereof, in such a manner that the variations in time of the main magnetic field B are followed. In order to achieve an optimum quality for the image of a magnetic resonance imaging device, the main magnetic field B as well as the oscillator signal should be as constant as possible or both should vary in time in the same way.

The degree of compensation can be determined from a functional relationship which defines, in conformity with a mathematical or empirical model, the relationship between the temperature and the characteristic quantity determined which corresponds to the temperature. It is advantageous to use for this purpose a look-up table which is stored in a memory 16 which can be accessed by the processing means 10.

Figure 2A:
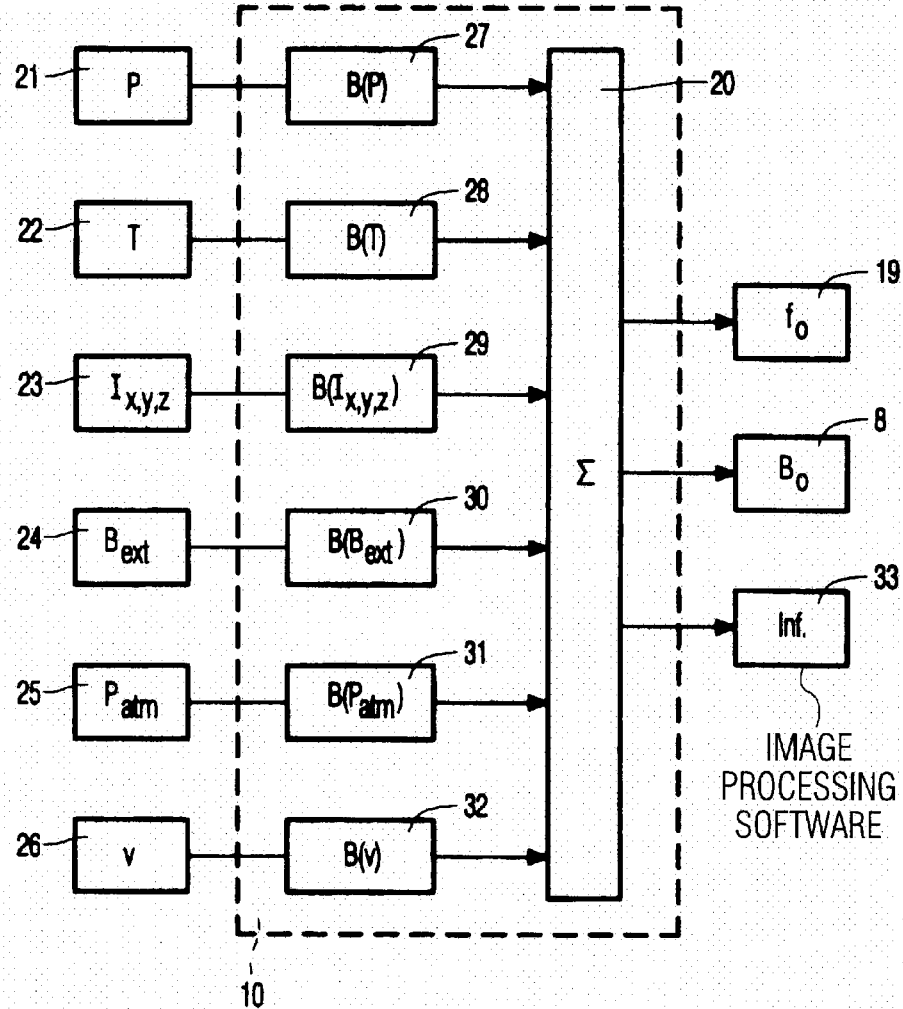
FIG. 2A shows diagrammatically the determination of a compensation signal from various measured quantities in accordance with the invention.

FIG. 2A illustrates diagrammatically the formation of a compensation signal by the weighing (20) of a number of quantities. The block 27, denoted by the reference B(P), represents the relationship between the electrical properties of the signals in the gradient magnet field coils 3 in the magnet system 2, i.e. the dissipated electric power P (block 21) and the field strength variation due to the heating of the shim iron 12, the shielding 13, etc.

The functional relationship B(P) in FIG. 2A can be explicated with reference to the symbolic representations of FIG. 2B. In FIG. 2B, each quantity (e.g., P, T, $I_{x,y,z}$, etc.) is represented generally by the parameter α, and the functional relationship B(α) is a general representation of the functional relationship between each quantity (parameter α) in FIG. 2A and the variation in the main magnetic field. Each parameter α causes a change $\delta_\alpha$ in the magnetizeable material X of the MRI device. For example, the parameter P (the dissipated electric power in the electric field coils) causes the magnetizeable material of the MRI device to become heated. This change in the magnetizeable material, $\delta_\alpha(X)$, causes a change $\delta_{\delta\alpha(X)}(B_{main})$ in the magnetic field strength $B_{main}$ of the main magnetic field. The functional relationship B(α) is the relationship between each quantity/parameter α in FIG. 2A and the variation $\delta_{\delta\alpha(X)}(B_{main})$ in the main magnetic field, where said variation was caused by the change $\delta_\alpha(X)$ in the magnetizeable material caused by quantity/parameter α.

Block 28, B(T), represents the relationship between the directly measured temperature T of the magnetizable material, block 22, and the field strength variation of the main magnetic field B.

Block 29, $B(I_{x,y,z})$, represents the effect exerted on the main magnetic field B by the temperature variations of the magnetizable material of the device which are caused by the current waveforms $I_{x,y,z}$, in the gradient magnetic field coils 3, block 23.

In addition to these quantities, the invention also proposes the determination of the effect of inter alia external magnetic fields $B_{ext}$, the atmospheric pressure $P_{atm}$, vibrations v, etc., by way of appropriate sensors or measuring means 24, 25, 26, respectively, and suitable transfer relationships which represent the effect of the measured quantity on the field strength of the main magnetic field B, that is to say $B_o(B_{ext})$ 30, $B_o(P_{atm})$31, $B_o(v)$32, respectively. These relationships can again be defined mathematically or by means of look-up tables or be implemented in the processing means 10.

The compensation signal generated by the weighting means 20 can be used for compensating the main magnetic field B via the $B_o$ coils 8 and/or for suitably adapting the frequency of the RF oscillator means 19. In the case of main magnetic field coils the influencing of the main magnetic field can also take place via the energizing means 5.

According to the invention a further possibility for the compensation of the effect of variations of the main magnetic field B includes the generation of a compensation signal such that the corrections are made directly upon formation of the image signal. This means that intervention takes place directly in the image processing software, block 33.

Figure 3:
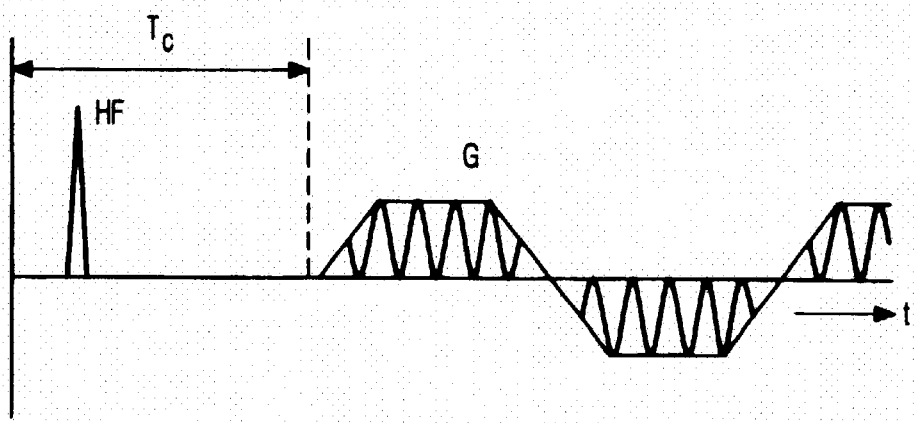
FIG. 3 shows diagrammatically a typical signal series for data acquisition during magnetic resonance imaging.

Because generally slow variations in time are concerned, the main magnetic field B can be measured each time at the beginning of a data acquisition period, compensation being performed, if necessary, as shown in FIG. 3. In order to enable measurement and compensation of faster variations, or in order to achieve an optimum imaging quality, evidently it is also possible to carry out the measurements and compensations one or more times during a data acquisition period.

A typical data acquisition period may comprise different measuring periods or repetition times, consisting of the generation of an RF excitation pulse (HF) and the subsequent application of one or more gradient magnetic fields G, generally being $G_x$, $G_y$ and $G_z$ as diagrammatically indicated in FIG. 3.

Adaptations of the magnetic field B via the $B_o$ coils 8 and/or the frequency of the oscillator means 19 can be carried out, if necessary, each time during the period of a scan as indicated by the arrow $T_c$.

The method according to the invention as described above for use in a magnetic resonance imaging device can also be used in devices for spectroscopy and the like.

All references cited herein, as well as the priority document European Patent Application 99200721.1 filed Mar. 10, 1999, are incorporated herein by reference in their entirety and for all purposes to the same extent as if each individual publication or patent or patent application was specifically and individually indicated to be incorporated by reference in its entirety for all purposes.

What is claimed is:

1. A method of compensating for variations in the magnetic field strength of the main magnetic field coils in a magnetic resonance imaging (MRI) device, comprising:

(a) determining a present value for each of a plurality of parameters, wherein said plural parameters comprise:
   temperature, wherein the temperature comprises at least one of the temperature of any magnetizeable material in the MR device, the atmospheric temperature in the vicinity of the MRI device, the temperature of the shim iron, and the temperature of any other portion of the MRI device;
   an amount of electrical power dissipated in at least one gradient magnetic field coil;
   an amount of electrical power dissipated in the main magnetic field coils;
   current gradient waveforms I,x,y,z.;
   one or more external magnetic fields;
   an amount of atmospheric pressure; and
   an amount of vibrations;

(b) using, for each one of the plural parameters, a lookup table created for each one of the plural parameters to find an effect signal corresponding to the present value of each one of the plural parameters, wherein said effect signal represents a variation in the magnetic field strength of the main magnetic coils caused by a change in magnetizable material in the MRI device, wherein the change in magnetizable material was caused, in turn, by each one of the plural parameters;

(c) generating a compensation signal by weighting and combining each of the plural effect signals found in step (b); and (d) at least one of the following steps:
   applying the generated compensation signal to a power signal of the main magnetic field coils;
   applying the generated compensation signal by adapting the frequency of an RF oscillator means in the MRI device; and
   applying the generated compensation signal directly upon an image signal by means of image processing software,
   in order to compensate for variations in magnetic field strength of the main magnetic field coils caused by changes in magnetizable material of the MRI device, which changes in magnetizable material, in turn, were caused by the plural parameters.

* * * * *